(12) United States Patent
Onozawa et al.

(10) Patent No.: US 7,133,431 B2
(45) Date of Patent: Nov. 7, 2006

(54) SEMICONDUCTOR LASER DEVICE AND METHOD FOR FABRICATING THE SAME

(75) Inventors: Kazutoshi Onozawa, Osaka (JP); Tetsuzo Ueda, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 193 days.

(21) Appl. No.: 10/629,670

(22) Filed: Jul. 30, 2003

(65) Prior Publication Data

US 2004/0037333 A1    Feb. 26, 2004

(30) Foreign Application Priority Data

Aug. 20, 2002  (JP)  ............... 2002-239636

(51) Int. Cl.
*H01S 5/00*   (2006.01)
(52) U.S. Cl. ............... 372/50.12; 372/50.121; 372/50.122
(58) Field of Classification Search ............... 372/50.1, 372/50.12, 50.121, 50.122, 50
See application file for complete search history.

(56) References Cited

U.S. PATENT DOCUMENTS

| | | | |
|---|---|---|---|
| 5,284,790 A | 2/1994 | Karpinski | |
| 5,545,291 A | 8/1996 | Smith et al. | |
| 5,783,856 A | 7/1998 | Smith et al. | |
| 5,824,186 A | 10/1998 | Smith et al. | |
| 5,904,545 A | 5/1999 | Smith et al. | |
| 6,259,713 B1* | 7/2001 | Hwu et al. | 372/36 |
| 6,347,103 B1* | 2/2002 | Song et al. | 372/36 |
| 6,643,310 B1* | 11/2003 | Nemoto | 372/50.1 |
| 6,780,696 B1* | 8/2004 | Schatz | 438/216 |
| 6,790,692 B1* | 9/2004 | Onozawa | 438/28 |

FOREIGN PATENT DOCUMENTS

| | | |
|---|---|---|
| JP | 11-144307 | 5/1999 |
| JP | 11-149652 | 6/1999 |
| JP | 11-186651 | 7/1999 |
| JP | 2000-349384 | 12/2000 |

OTHER PUBLICATIONS

Office Action dated May 19, 2006.

* cited by examiner

*Primary Examiner*—James Menefee
(74) *Attorney, Agent, or Firm*—McDermott Will & Emery LLP

(57) ABSTRACT

A semiconductor laser device includes a substrate which is made of, e.g., silicon and which has in its principal surface first and second recessed portions formed at a distance from each other. Disposed in the first recessed portion is a first semiconductor laser chip in the form of a function block, which emits an infrared laser beam. Disposed in the second recessed portion is a second semiconductor laser chip in the form of a function block, which emits a red laser beam.

7 Claims, 9 Drawing Sheets

SEMICONDUCTOR LASER DEVICE AND METHOD FOR FABRICATING THE SAME

BACKGROUND OF THE INVENTION

The present invention relates to semiconductor laser devices and methods for fabricating the devices, and more particularly relates to semiconductor laser devices which are used as a light source for the reading or writing of data from or on optical storage mediums such as compact discs and digital versatile discs, and methods for fabricating the devices.

Typical digital-versatile-disc (hereinafter referred to as "DVD") players need to function to play back compact discs (hereinafter referred to as "CDs") in addition to DVDs, and also have to function to replay, and store data on, recordable CDs (CD-Rs) which have become widespread rapidly in recent years.

As a light for replaying DVDs, a red laser beam with a wavelength in the 650 nm band is employed, while an infrared laser beam with a wavelength in the 780 nm band is used as a light for playing back CDs and CD-R discs. In the currently available DVD players, therefore, two semiconductor laser diodes are incorporated: one is a red semiconductor laser diode for generating a red laser beam and the other is an infrared semiconductor laser diode for generating an infrared laser beam.

With an increasing demand for smaller personal computers and other information equipment, DVD players also need to be reduced further in size and thickness. To that end, it is indispensable to reduce the size and thickness of optical pickup. Methods for reducing optical pickup in size and thickness include optical system simplification.

As a method for simplifying an optical system, integration of a red semiconductor laser diode and an infrared semiconductor laser diode is available. The current DVD players include two optical systems: one for a red semiconductor laser diode and the other for an infrared semiconductor laser diode. Integration of the red semiconductor laser diode and the infrared semiconductor laser diode allows one optical system to be shared, thereby realizing an optical pickup system of smaller size and thickness.

For instance, as one example of the integration of a red semiconductor laser diode and an infrared semiconductor laser diode, a so-called monolithic semiconductor laser diode array which is integrated on a substrate is disclosed in Japanese Laid-Open Publication No. 11-186651.

Japanese Laid-Open Publication Nos. 11-144307 and 11-149652 disclose another example, in which hybrid integration of two semiconductor laser chips, one for a red laser and the other for an infrared laser, enables an optical system to be shared in an optical pickup system.

Nevertheless, in the conventional monolithic two-wavelength laser diode array, the respective active layers of the laser diodes have different compositions and thus have to be grown in different process steps, which results in the problem of low yields. In particular, when high-output laser diodes are monolithically integrated, yields decrease significantly.

Moreover, it is very difficult, in the viewpoint of crystal growth, to monolithically integrate a gallium nitride (GaN)-based blue laser diode, which is used in high density DVDs, and an aluminum gallium indium phosphide (AlGaInP)-based red laser diode, which is used in typical (conventional) DVDs.

The conventional hybrid optical pickup, on the other hand, have the problem that when the red semiconductor laser chip and the infrared semiconductor laser chip are assembled using assembly equipment, it is difficult to control and optimize the locations of active layers of the semiconductor laser chips and the distance between the light emitting points thereof.

In recent years, mounting methods in which a fluidic self-assembly (hereinafter referred to as "FSA") technique is used have been developed as one type of device-mounting method.

In the FSA technology, devices (hereinafter referred to as "function blocks") ranging in size from 10 μm to several hundred μm and having given shapes are suspended into a liquid to form a slurry. The liquid (suspension) in the form of slurry is poured over the surface of a substrate in which recessed portions have been formed. The recessed portions are substantially the same as the function blocks in size and shape. In this manner, the function blocks that have been spread in the liquid are settled into the recessed portions and thereby mounted onto the substrate.

The FSA technology is disclosed in U.S. Pat. No. 5,545,291, U.S. Pat. No. 5,783,856, U.S. Pat. No. 5,824,186 and U.S. Pat. No. 5,904,545, for example.

SUMMARY OF THE INVENTION

An object of the present invention is therefore that by focusing attention on the FSA technology, in a hybridly-integrated semiconductor laser chip array, the distance between the respective emission points of the semiconductor laser chips can be controlled in a self-aligned manner.

To achieve the object, a semiconductor laser device according to the present invention has the structure in which semiconductor laser chips whose emission directions are aligned are disposed in recessed portions formed in the principal surface of a substrate.

Specifically, a first inventive semiconductor laser device includes: a substrate having a plurality of recessed portions in its principal surface, and a plurality of semiconductor laser chips each disposed in one of the recessed portions. The semiconductor laser chips are a facet-emitting type in which a laser beam is emitted from a facet, and the recessed portions are formed so that the respective emission directions of the semiconductor laser chips are aligned with each other.

In the first inventive semiconductor laser device, the semiconductor laser chips are disposed in the respective recessed portions formed in the principal surface of the substrate, and in addition the recessed portions are formed so that the respective emission directions of the semiconductor laser chips are aligned with each other. Thus, only by disposing the semiconductor laser chips into the recessed portions in the substrate, the locations of the respective active layers of the semiconductor laser chips self-align with each other, and the respective light-emitting points of the semiconductor laser chips also self-align with each other at a uniform distance.

In addition, the semiconductor laser chips are capable of being integrated together, even if their constituents (compositions) differ from each other. Further, the recessed portions themselves function to align the emission directions of the semiconductor laser chips, such that wavefront aberration of a spot formed when the resultant semiconductor laser device is used in an optical pickup system can be reliably within an allowable range.

In the first inventive semiconductor laser device, two of the semiconductor laser chips preferably have mutually different emission wavelengths.

Also, in the first inventive semiconductor laser device, two of the semiconductor laser chips preferably have mutually different optical outputs.

In the first inventive semiconductor laser device, a notch, through which a laser-emitting portion of an associated one of the semiconductor laser chips is exposed, is preferably formed in the substrate.

Then, even if the semiconductor laser device has a structure in which each facet-emitting-type semiconductor laser chip is embedded in the recessed portion in the substrate, a laser beam can be obtained through the notch.

In this case, at least two said notches are preferably formed.

Also in this case, the notch preferably has the shape of a depression and the lower end of the notch preferably reaches the bottom face of an associated one of the recessed portions.

In the first inventive semiconductor laser device, the front facet side of each said semiconductor laser chip preferably differs in shape from the rear facet side thereof that faces the front facet side.

Then, when the semiconductor laser chips are disposed into the recessed portions, the front and rear ends of each semiconductor laser chip in its emission direction can be selectively positioned.

Further, in the first inventive semiconductor laser device, in each said semiconductor laser chip, optical output from its front facet is preferably equal to optical output from its rear facet.

Then, the emission direction for the semiconductor laser chips does not have to be selected, which further facilitates the manufacturing of the device.

In the first inventive semiconductor laser device, a recess electrode is preferably formed on the bottom face of each said recessed portion, a chip electrode is preferably formed on a face of each said semiconductor laser chip which faces the bottom face of the associated one of the recessed portions, and each said semiconductor laser chip is preferably electrically connected to the associated recess electrode via the chip electrode.

Then, even if each semiconductor laser chip is structured to have a chip electrode on its bottom face, an operating current can be reliably supplied to the semiconductor laser chip by establishing electrical connection with an associated recess electrode from the substrate bottom, for example.

In the first inventive semiconductor laser device, the semiconductor laser chips preferably differ from each other in plan configuration, and the plan configurations of the recessed portions preferably vary according to the associated semiconductor laser chips.

Then, the respective semiconductor laser chips can be selectively disposed into the recessed portions formed in the substrate.

In this case, the plan configurations of the semiconductor laser chips preferably vary in accordance with their emission wavelengths. Then, a two-wavelength laser chip array can be reliably obtained.

Also in this case, the semiconductor laser chips preferably vary in shape in accordance with their optical outputs. Then, a laser chip array in which different functions, such as writing and reading, can be performed is reliably obtainable.

A second inventive semiconductor laser device includes: a substrate having a plurality of recessed portions in its principal surface, and a plurality of semiconductor laser chips each disposed in one of the recessed portions. A chip electrode is formed on a face of each said semiconductor laser chip which faces the bottom face of the associated one of the recessed portions, and a recess electrode is formed on the bottom face of each said recessed portion in such a manner that an end portion of the recess electrode extends beyond the principal surface of the substrate.

In the second inventive semiconductor laser device, the semiconductor laser chips are disposed in the respective recessed portions formed in the principal surface of the substrate, and each recess electrode is formed so that an end portion thereof extends beyond the principal surface of the substrate. Then, even after the semiconductor laser chips have been disposed in the recessed portions in the substrate, electrical connection for the chip electrodes formed on the respective bottoms of the semiconductor laser chips is easily established from the principal surface side of the substrate.

In addition, the semiconductor laser chips are capable of being integrated together, even if their constituents (compositions) differ from each other. Further, the recessed portions themselves can function to align the emission directions of the semiconductor laser chips, such that wavefront aberration of a spot formed when the resultant semiconductor laser device is used in an optical pickup system can be reliably within an allowable range.

In the second inventive semiconductor laser device, the recess electrode is preferably so formed as to be shared by the semiconductor laser chips.

Then, even if the semiconductor laser chips have mutually different emission wavelengths, a common chip electrode can be formed on the bottom faces of the semiconductor laser chips that forms a laser chip array.

An inventive method for fabricating a semiconductor laser device includes the steps of (a) forming a plurality of recessed portions in the principal surface of: a substrate, and (b) spreading a plurality of semiconductor laser elements in the form of chips in a liquid and pouring the semiconductor-laser-element-spread liquid over the principal surface of the substrate, thereby allowing the semiconductor laser elements to be disposed into the respective recessed portions in a self-aligned manner. The semiconductor laser elements are a facet-emitting type in which a laser beam is emitted from a facet, and in the step (a), the recessed portions are formed so that the respective emission directions of the semiconductor laser elements are aligned with each other.

According to the inventive semiconductor laser device fabrication method, by using a so-called FSA technique, a liquid in which semiconductor laser elements have been spread is poured over the principal surface of a substrate so that the semiconductor laser elements are disposed into recessed portions in a self-aligned manner. Thus, only by disposing the semiconductor laser elements into the recessed portions in the substrate, the locations of the respective active layers of the semiconductor laser elements self-align with each other, and the respective light-emitting points of the semiconductor laser elements also self-align with each other at a uniform distance.

In addition, the semiconductor laser elements are capable of being integrated together, even if their constituents (compositions) differ from each other. Further, the recessed portions themselves function to align the emission directions of the semiconductor laser elements, such that wavefront aberration of a spot formed when the resultant semiconductor laser device is used in an optical pickup system can be reliably within an allowable range.

In the inventive semiconductor laser device fabrication method, the step (a) preferably includes the step of forming in the substrate a notch through which a laser-emitting portion of an associated one of the semiconductor laser elements is exposed.

Then, even if each facet-emitting-type semiconductor laser element is disposed in the recessed portion in the substrate, a laser beam can be obtained through the notch.

In the inventive method, in the step (a), the recessed portions are preferably so formed as to vary in plan configuration in accordance with the shapes of the associated semiconductor laser elements.

Then, the semiconductor laser elements with mutually different emission wavelengths can be selectively disposed into the recessed portions formed in the substrate even by a FSA process, which allows a two-wavelength laser chip array, for example, to be obtained reliably.

BRIEF DESCRIPTION OF THE DRAWINGS

FIG. 1A is a plan view, FIG. 1B is a right-side view, and FIG. 1C is a front view.

FIG. 2A is a plan view, and FIG. 2B is a right-side view.

FIG. 6A is a plan view, and FIG. 6B is a partial enlarged plan view.

DESCRIPTION OF THE PREFERRED EMBODIMENTS

Hereinafter, an embodiment of the present invention will be described with reference to the accompanying drawings.

Figure 1A:
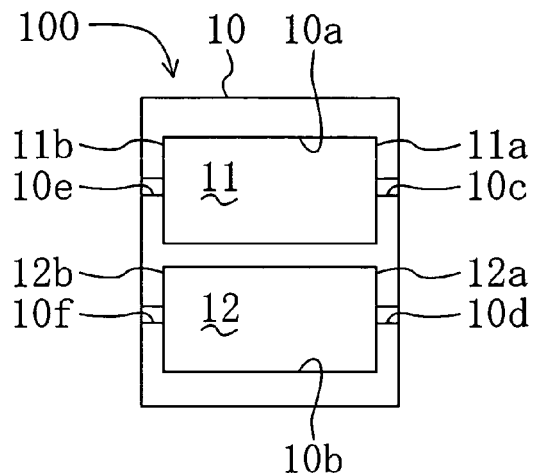
FIGS. 1A through 1C schematically illustrate a semiconductor laser device in accordance with an embodiment of the present invention.
Figure 1B:
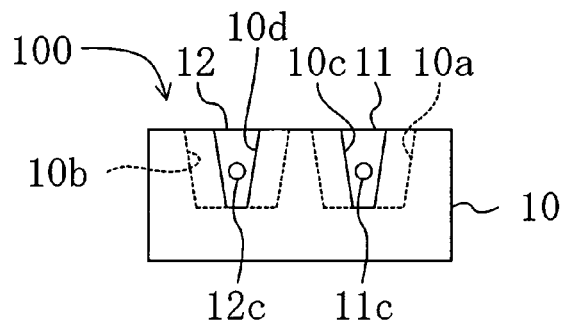
Figure 1C:
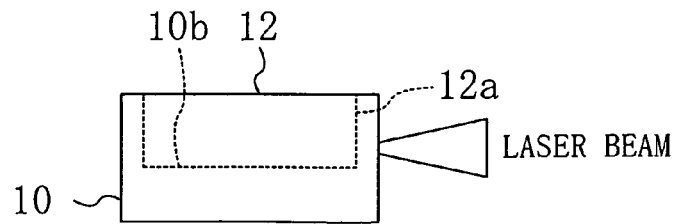

FIGS. 1A through 1C illustrate a semiconductor laser device in accordance with an embodiment of the present invention. FIG. 1A shows a plan configuration, FIG. 1B shows a right-side configuration, and FIG. 1C shows a front configuration.

As shown in FIG. 1A, a semiconductor laser device 100 in accordance with this embodiment includes a substrate 10, which is made of silicon (Si), for example, and which has in its principal surface first and second recessed portions 10a and 10b formed at a distance from each other.

Disposed in the first recessed portion 10a is a first semiconductor laser chip 11 in the form of a function block, which emits an infrared laser beam, for example. Disposed in the second recessed portion 10b is a second semiconductor laser chip 12 in the form of a function block, which emits a red laser beam, for example.

In this embodiment, the material forming the substrate 10 is not limited to silicon, but the substrate 10 may be made of gallium arsenide (GaAs) or silicon carbide (SiC), for example, and is preferably made of material having excellent thermal conductivity. The material forming the substrate 10 may be selected in accordance with the type of function block and the application of the semiconductor laser device 100, for example.

The emission wavelengths of the first and second semiconductor laser chips 11 and 12 are not limited to the above-described combination. For example, any two laser beams may be selected from infrared, red, and blue laser beams. Moreover, a third recessed portion may be so formed in the substrate 10 as to be located alongside, e.g., the first recessed portion 10a, and three semiconductor laser chips that emit mutually different laser beams may be respectively disposed into those recessed portions. Furthermore, four or more recessed portions may be formed in the substrate 10, and laser chips may be disposed into the respective recessed portions.

The semiconductor laser device 100 is applicable in an optical pickup system (not shown) for use in the reading or writing of data from or on an optical disc. In this embodiment, the semiconductor laser chips 11 and 12 are both so-called facet-emitting semiconductor laser chips in which a grown semiconductor layer facet emits a laser beam. As shown in FIGS. 1B and 1C, the semiconductor laser chips 11 and 12 are arranged so that laser beams emitted from their respective laser-emitting facets 11a and 12a enter an objective lens incorporated in the optical pickup system.

This embodiment is therefore characterized in that as shown in FIG. 1B, first and second notches 10c and 10d are formed in the substrate 10 in such a manner that the respective laser-emitting portions (resonator facets) 11c and 12c of the laser-emitting facets of the first and second semiconductor laser chips 11 and 12 are exposed through the first and second notches 10c and 10d. With the notches 10c and 10d formed in the substrate 10 in this manner, even if the semiconductor laser chips 11 and 12 are so structured as to be fitted into the recessed portions 10a and 10b in the substrate 10, the respective emitted lights can be obtained as shown in FIG. 1C.

Further, third and fourth notches 10e and 10f are also formed in the substrate 10 so that laser beams for a power monitor are obtained from the respective rear facets 11b and 12b of the semiconductor laser chips 11 and 12 through the third and fourth notches 10e and 10f. The rear facets 11b and 12b are located opposite to the laser-emitting facets 11a and 12a, respectively. The third and fourth notches 10e and 10f for the power monitor are not necessarily needed, and whether they should be formed or not may be determined depending upon the application of the semiconductor laser device 100.

In this embodiment, as shown in FIG. 1B, the respective plan configurations of the first and second semiconductor laser chips 11 and 12 in the form of the function blocks are rectangular, and the respective sections thereof taken in a vertical direction with respect to their emission directions are in the shape of a trapezoid.

The respective configurations of the function blocks are not limited to this, but may be varied depending upon the application and function. Specifically, the plan configuration of each function block may be, e.g., a square or a circle; or a shape having 2-fold rotational S symmetry such as a parallelogram, an ellipse, or an oval; or a shape having 1-fold rotational symmetry such as a trapezoid. It should be however noted that in the case of a square or a circle, it becomes slightly difficult to align the respective emission directions of the function blocks.

As described above, in this embodiment, the semiconductor laser chips 11 and 12, which differ from each other in emission wavelength and have been formed into the function blocks, are arranged so that the respective laser-emitting directions are substantially parallel with each other. This enables the laser-emitting portions 11c and 12c of the semiconductor laser chips 11 and 12 to self-align, such that wavefront aberration created in the optical system for the laser beams can be reliably reduced.

It should be noted that the first and second semiconductor laser chips 11 and 12 may be so structured as to have the same emission wavelength and different optical output values.

Also, the first and second semiconductor laser chips 11 and 12 may be established in such a manner that optical output from the laser-emitting facet 11a is equivalent to optical output from the rear facet 11b, and that optical output from the laser-emitting facet 12a is equivalent to optical output from the rear facet 12b. Then, it is not necessary to make a distinction between the front and rear directions for each of the first and second semiconductor laser chips 11 and 12, which facilitates the process step of disposing the semiconductor laser chips 11 and 12 into the first and second recessed portions 10a and 10b.

Furthermore, the locations in which the semiconductor laser chips 11 and 12 in the form of the function bocks are disposed are not limited to this embodiment.

(First Modified Example)

Hereinafter, a first modified example of the embodiment of the present invention will be described with reference to the accompanying drawings.

Figure 2A:
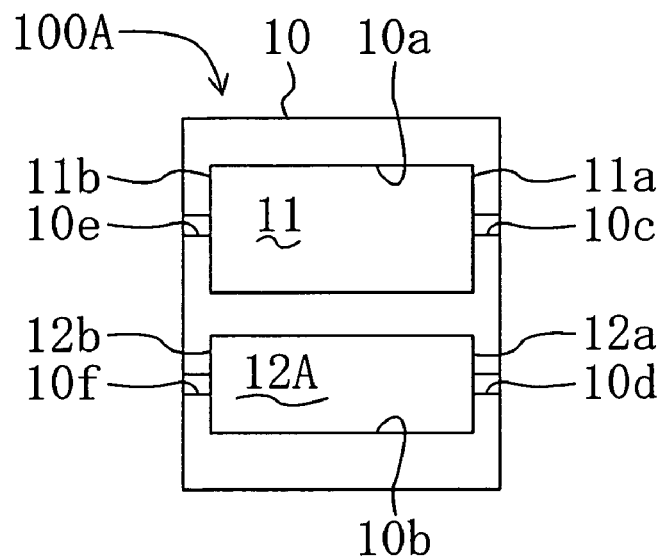
FIGS. 2A and 2B schematically illustrate a semiconductor laser device in accordance with a first modified example of the embodiment of the present invention.
Figure 2B:
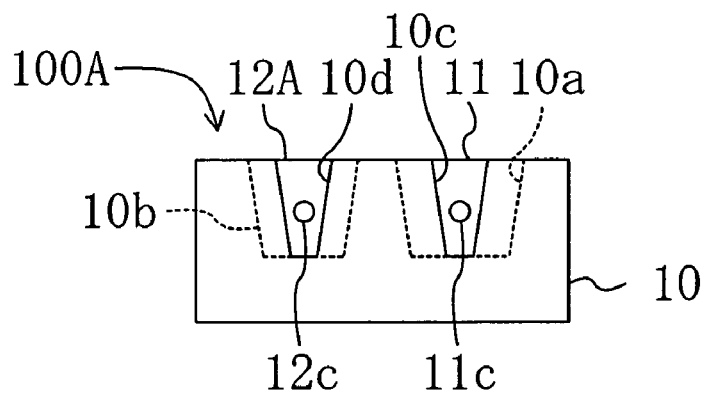

FIGS. 2A and 2B illustrate a semiconductor laser device in accordance with a first modified example of the embodiment of the present invention. FIG. 2A shows a plan configuration, and FIG. 2B shows a right-side configuration. In FIGS. 2A and 2B, the same members as those shown in FIGS. 1A and 1B are identified by the same reference numerals and the descriptions thereof will be omitted herein.

As shown in FIGS. 2A and 2B, in a semiconductor laser device 100A according to the first modified example, the width dimension of a second semiconductor laser chip 12A, which is the dimension in a vertical direction with respect to its emission direction, is made smaller than the width dimension of a first semiconductor laser chip 11. This facilitates the process of selectively disposing the semiconductor laser chips 11 and 12A that have mutually different laser-emitting wavelengths or mutually different optical output values. Also in this case, the laser-emitting facets 11a and 12a of the semiconductor laser chips 11 and 12A are located in alignment with each other, and the heights of their laser-emitting portions 11c and 12c are made equal to each other, for example.

Second Modified Example

Next, a second modified example of the embodiment of the present invention will be described with reference to the accompanying drawings.

Figure 3:
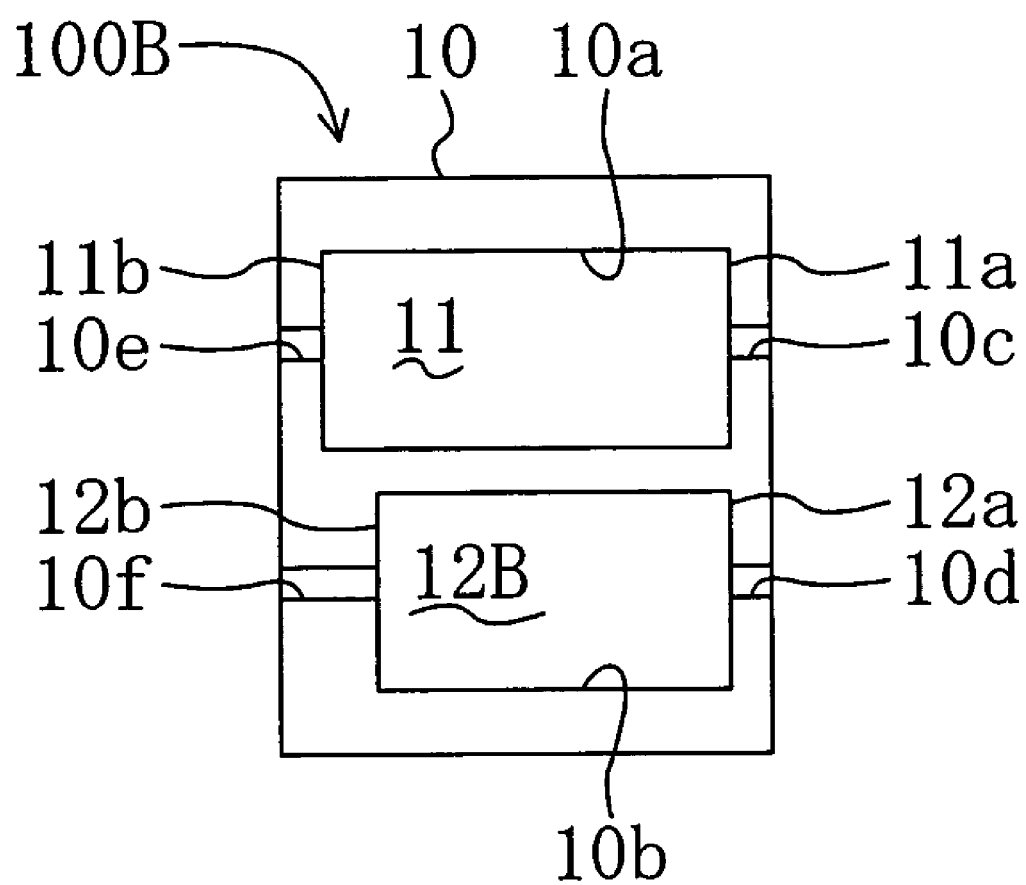
FIG. 3 is a plan view schematically illustrating a semiconductor laser device in accordance with a second modified example of the embodiment of the present invention.

FIG. 3 illustrates the plan configuration of a semiconductor laser device in accordance with a second modified example of the embodiment of the present invention. In FIG. 3, the same members as those shown in FIG. 1A are identified by the same reference numerals.

As shown in FIG. 3, in a semiconductor laser device 100B according to the second modified example, the length dimension of a second semiconductor laser chip 12B, which is the dimension in a parallel direction with respect to its emission direction, is made smaller than the length dimension of a first semiconductor laser chip 11. This also facilitates the process of disposing in the desired locations the semiconductor laser chips 11 and 12B that have mutually different laser-emitting wavelengths or mutually different optical output values. Also in this case, the laser-emitting facets 11a and 12a of the semiconductor laser chips 11 and 12B are located in alignment with each other, and the heights of their laser-emitting portions 11c and 12c are made equal to each other, for example.

Third Modified Example

Next, a third modified example of the embodiment of the present invention will be described with reference to the accompanying drawings.

Figure 4:
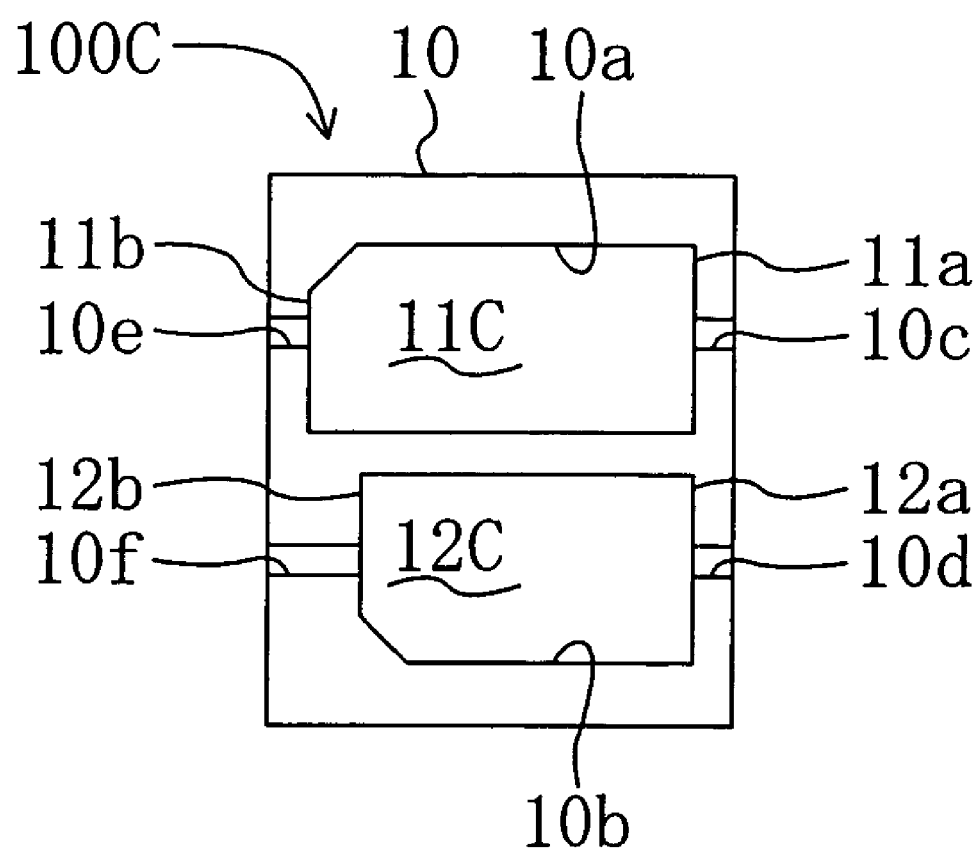
FIG. 4 is a plan view schematically illustrating a semiconductor laser device in accordance with a third modified example of the embodiment of the present invention.

FIG. 4 illustrates the plan configuration of a semiconductor laser device in accordance with a third modified example of the embodiment of the present invention. In FIG. 4, the same members as those shown in FIG. 1A are identified by the same reference numerals.

In a semiconductor laser device 100C according to the third modified example, first and second semiconductor laser chips 11C and 12C are both high-output laser chips, and their respective end portions located on their rear facet 11b and 12b sides differ in plan configuration from their respective end portions located on their laser-emitting facet 11a and 12a sides which are situated opposite to the rear facets 11b and 12b sides. Further, as in the second modified example, the length dimension of the second semiconductor laser chip 12C is made smaller than the length dimension of the first semiconductor laser chip 11C.

In a typical high-output laser chip, a laser output value (power) on the laser-emitting facet side thereof differs greatly from a laser output value on its rear facet side. The laser-emitting facet and the rear facet thus have to be positively distinguished from each other.

In the third modified example, therefore, as shown in FIG. 4, the semiconductor laser chips 11C and 12C are formed so that their laser-emitting facets 11a and 12a differ in shape from their rear facets 11b and 12b, respectively, which allows the emission directions of the semiconductor laser chips 11C and 12C to be aligned reliably.

It should be noted that the plan configurations of the semiconductor laser chips 11C and 12C shown in FIG. 4 are merely an example, and thus are not limited to those shapes so long as the plan configurations of their respective front and rear end portions are asymmetrical.

In the case where both p-side and n-side electrodes serving as chip electrodes for the first and second semiconductor laser chips 11 and 12 are formed at the principal surface side of the substrate 10, electrodes (recess electrodes) do not have to be formed on the respective bottom faces of the recessed portions 10a and 10b.

However, recess electrodes have to be formed on the bottom faces of the recessed portions 10a and 10b when a p-side chip electrode and an n-side chip electrode are respectively formed on the upper and bottom faces of each of the semiconductor laser chips 11 and 12 in such a manner that the chip electrodes face each other.

Figure 5A:
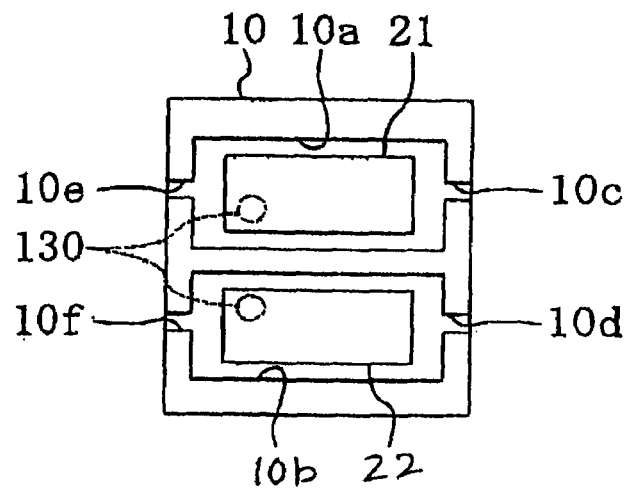
FIGS. 5A through 5C are plan views schematically illustrating recessed portions and recess electrodes formed in respective substrates of semiconductor laser devices in accordance with the embodiment of the present invention.
Figure 5B:
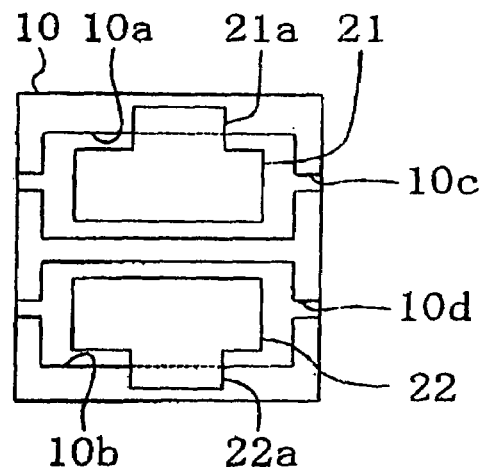
Figure 5C:
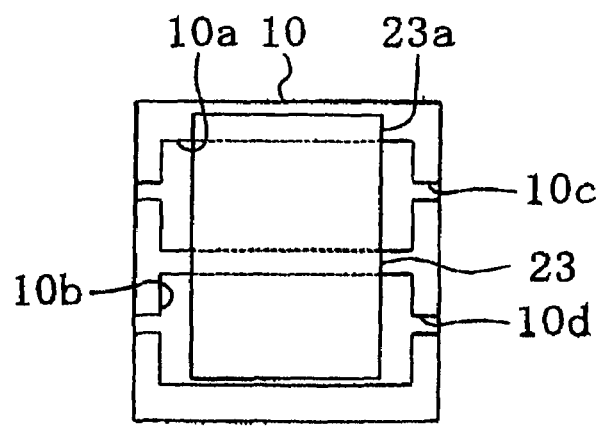

FIGS. 5A through 5C illustrate the respective plan configurations of recess electrodes formed in three different ways.

FIG. 5A illustrates recess electrodes according to a first example. As shown in FIG. 5A, in order to drive the first and second semiconductor laser chips 11 and 12, first and second recess electrodes 21 and 22 made of low-melting-point metal such as solder material are respectively formed on the bottom faces of the recessed portions 10a and 10b in the substrate 10.

After the semiconductor laser chips 11 and 12 in the form of the function blocks have been disposed into the respective recessed portions 10a and 10b in the substrate 10 by a FSA technique, which will be described later, the first and second recess electrodes 21 and 22 are heated to a degree at which the solder material melts. In this manner, the chip electrodes of the semiconductor laser chips 11 and 12 are electrically connected to the recess electrodes 21 and 22, respectively.

Further, the first and second recess electrodes 21 and 22 are electrically connected to the outside of the substrate 10 through vias 130, which may be formed by, for example, filling, with conductive material, through-holes which are formed in the substrate 10 under the recess electrodes.

Next, FIG. 5B illustrates recess electrodes according to a second example. As shown in FIG. 5B, extended portions 21a and 22a are respectively formed on the outer sides of first and second recess electrodes 21 and 22 which are in parallel with the emission directions. The extended portions 21a and 22a extend from the bottom faces of the recessed portions 10a and 10b in the substrate 10 beyond the principal surface of the substrate 10. Since the recess electrodes 21 and 22 have the respective extended portions 21a and 22a in this manner, electrical connection for the chip electrodes formed on the respective bottom faces of the semiconductor laser chips can be established from the principal surface side of the substrate 10 without forming vias 130 in the lower portion of the substrate 10.

Next, FIG. 5C illustrates recess electrodes according to a third example. As shown in FIG. 5C, a shared recess electrode 23 is formed on the bottom faces of the first and second recessed portions 10a and 10b so that the shared recess electrode 23 extends across the boundary between the bottom faces. Also in this example, an extended portion 23a is formed on the outer side of a first recess electrode 21 which is in parallel with the emission direction, in such a manner that the extended portion 23a extends from the bottom face of the first recessed portion 10a beyond the principal surface of the substrate 10. With the shared recess electrode 23 so formed, even if the first and second semiconductor laser chips 11 and 12 have mutually different emission wavelengths, the semiconductor laser chips, which forms a laser chip array, are allowed to have a common chip electrode on their bottom faces.

In forming the shared recess electrode 23, if the boundary portion between the first and second recessed portions 10a and 10b in the substrate 10 is removed so that the boundary portion has substantially the same height as the bottom faces of the recessed portions 10a and 10b, then it becomes easier to form the shared recess electrode 23.

The foregoing has described how to make conductive the bottom-face electrodes of the chip electrodes of the semiconductor laser chips. For the upper-face chip electrodes that are exposed at the principal surface side of the substrate 10, interconnection can be relatively easily established by wire bonding.

Fabrication Method

Hereinafter, it will be described how to fabricate a semiconductor laser device 100 having the above-described structure with reference to the accompanying drawings.

As show in FIGS. 1A through 1C, the semiconductor laser device 100 according to the present invention is characterized in that by disposing the semiconductor laser chips 11 and 12 in the form of the function blocks into the recessed portions 10a and 10b formed in the substrate 10, their respective laser-emitting portions 11c and 12c can self-align.

The semiconductor laser chips 11 and 12 in the form of the function blocks can be disposed into the respective recessed portions 10a and 10b formed in the substrate, manually or by assembly equipment.

However, in this embodiment, the efficiency of the process step of disposing (mounting) the laser chips is significantly increased by using the above-mentioned FSA technology.

First, a method for forming the inventive recessed portions on the principal surface of a substrate will be described.

Figure 6A:
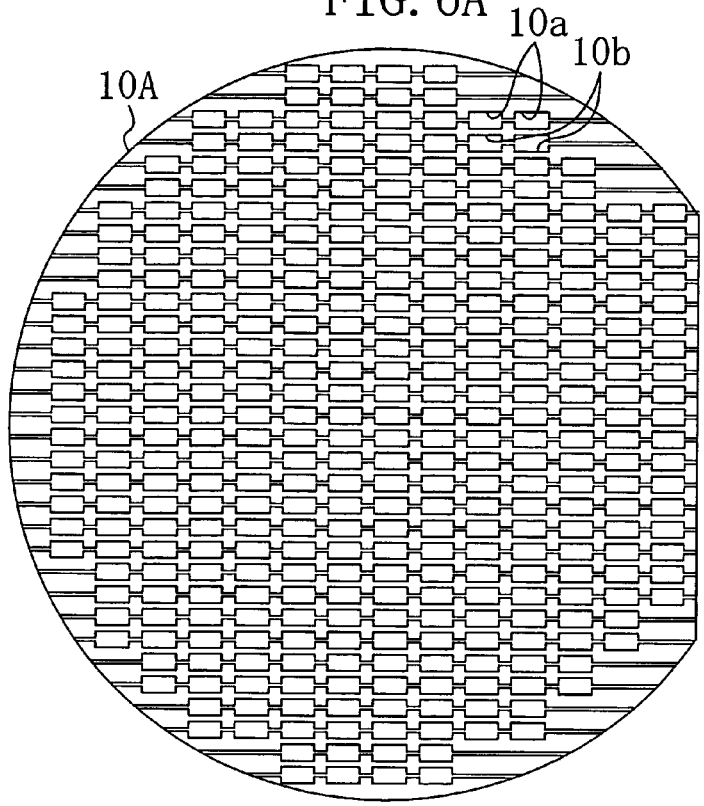
FIGS. 6A and 6B illustrate a substrate, being in a wafer state, of semiconductor laser devices according to the embodiment of the present invention.
Figure 6B:
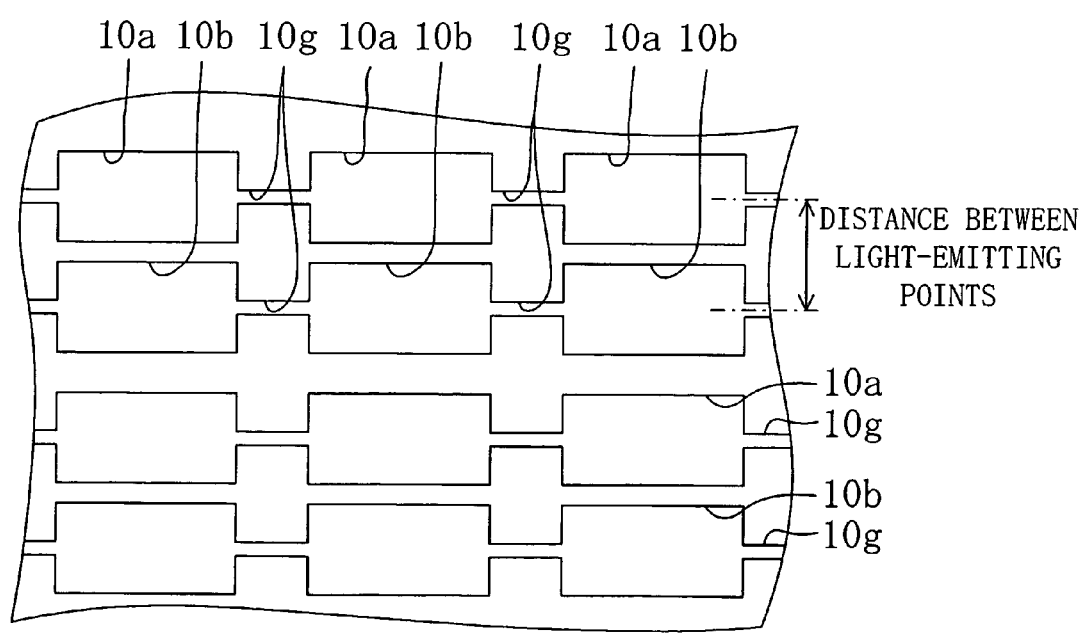

FIGS. 6A and 6B illustrate a wafer 10A, which will serve as a substrate for semiconductor laser devices according to the embodiment of the present invention, which is made of silicon, gallium arsenide, or silicon carbide, and in which a plurality of recessed portions have been formed. FIG. 6A illustrates the plan configuration of the wafer 10A, and FIG. 6B shows on an enlarged scale a part of the wafer 10A shown in FIG. 6A.

As shown in the enlarged partial view in FIG. 6B, a plurality of the first recessed portions 10a and a plurality of the second recessed portions 10b, which are adjacent to the first recessed portions 10a, are arranged in the principal surface of the wafer 10A as first and second recess rows, respectively, in such a manner as to be located in parallel with each other at a distance from each other in the longitudinal directions (laser-emitting directions) of the recesses. Semiconductor laser chips in the form of function blocks will be disposed into the first and second recessed portions 10a and 10b.

In the principal surface of the wafer 10A, a groove 10g is also formed in the region between any two of the first recessed portions 10a which are adjacent to each other in the longitudinal direction as well as in the region between any two of the second recessed portions 10b which are adjacent to each other in the longitudinal direction. The grooves 10g will act as notches through which emitted light is obtained after the wafer 10A is divided.

—Method for Forming a Substrate—

Hereinafter, an exemplary method for forming a substrate will be described.

FIGS. 7A through 7F are cross-sectional views illustrating process steps for forming recessed portions in a substrate of a semiconductor laser device in accordance with the embodiment of the present invention. Herein, a wafer 10A made of silicon is used, and by focusing attention only on a first recessed portion 10a formed in part of the wafer 10A, the figures illustrate such part of the wafer 10A in cross section taken in a vertical direction with respect to the emission direction.

Figure 7A:
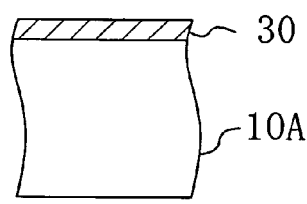
FIGS. 7A through 7F are cross-sectional views illustrating process steps in a method for fabricating a semiconductor laser device in accordance with the embodiment of the present invention.

As shown in FIG. 7A, a mask film 30 of silicon dioxide (SiO$_2$) is deposited to a thickness of about 0.7 μm to 1 μm on the principal surface of the wafer 10A by a CVD process, for example.

Figure 7B:
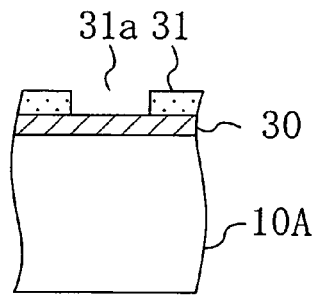

Next, as shown in FIG. 7B, a resist pattern 31 is selectively formed by lithography. The resist pattern 31 has an opening pattern 31a for the first recessed portions 10a and an opening pattern (not shown) for grooves 10g which will serve as notches.

Figure 7C:
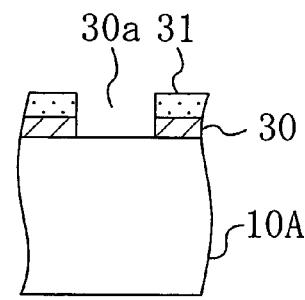

Then, as shown in FIG. 7C, with the resist pattern 31 acting as a mask, the mask film 30 is dry-etched using fluorocarbon, for example, as an etching gas, such that the opening pattern 30a for the first recessed portions 10a and the opening pattern (not shown) for the grooves 10g are transferred to the mask film 30.

Figure 7D:
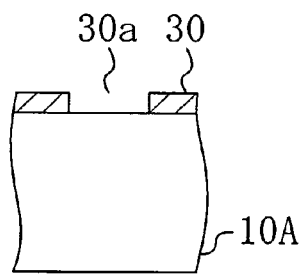
Figure 7E:
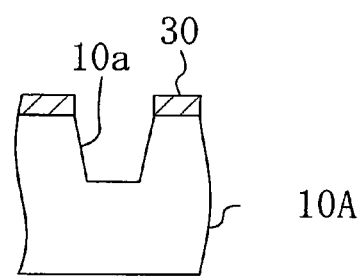

Subsequently, as shown in FIG. 7D, the resist pattern 31 is removed by ashing. Thereafter, as shown in FIG. 7E, with the mask film 30 having the opening pattern 30a acting as a mask, the wafer 10A is dry-etched using chlorine ($Cl_2$) or hydrogen bromide (HBr), for example, as an etching gas, so that the first recessed portions 10a are formed in the wafer 10A. In this process step, the type of etching performed for the wafer 10A is not limited to the dry etching, but the wafer 10A may be wet-etched using a mixed solution of hydrofluoric acid and nitric acid. Second recessed portions 10b and grooves connected thereto are formed in the same manner as, and at the same time with, the first recessed portions 10b and the grooves 10g connected thereto.

Figure 7F:
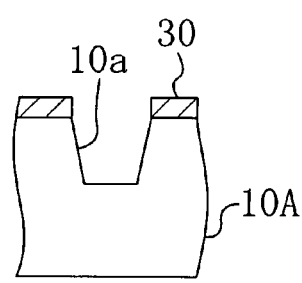

Subsequently, as shown in FIG. 7F, the wafer 10A in which the recessed portions 10a have been formed is washed with water, and then dried.

Thereafter, when recess electrodes are necessary, one of the recess electrodes shown in FIGS. 5A through 5C is formed.

—Method for Mounting Semiconductor Laser Chips—

Next, it will be described how to mount semiconductor laser chips.

A method for mounting semiconductor laser chips in accordance with this embodiment employs a FSA technique as a method for disposing the first and second semiconductor laser chips 11 and 12 in the form of the function blocks into the respective recessed portions 10a and 10b formed in the wafer 10A. The use of the FSA technique enables the first and second semiconductor laser chips 11 and 12 in the form of the function blocks to be disposed in the desired locations precisely and highly efficiently.

In the FSA technology, function blocks are spread into a fluid (medium) such as water ($H_2O$) or methyl alcohol ($CH_3OH$). In the case of assembling two-wavelength laser chip arrays, therefore, the first and second semiconductor laser chips 11 and 12 preferably have different plan configurations. Specifically, it is preferable to form in the wafer 10A recessed portions 10a and 10b in which the first and second semiconductor laser chips 11C and 12C of the third modified example shown in FIG. 4 can be disposed, for example.

Further, of the first and second semiconductor laser chips 11C and 12C, the laser chips having a larger plan dimension, that is, the first semiconductor laser chips 11C are preferably disposed first.

Therefore, hereinafter, fabrication of a semiconductor laser device 100C according to the third modified example will be described.

First, when recess electrodes have been formed on the bottom faces of the first and second recessed portions 10a and 10b, solder material is applied onto the recess electrodes. In the case where the recess electrodes are not formed, a thermosetting adhesive or a UV-setting adhesive, for example, may be applied.

Figure 8:
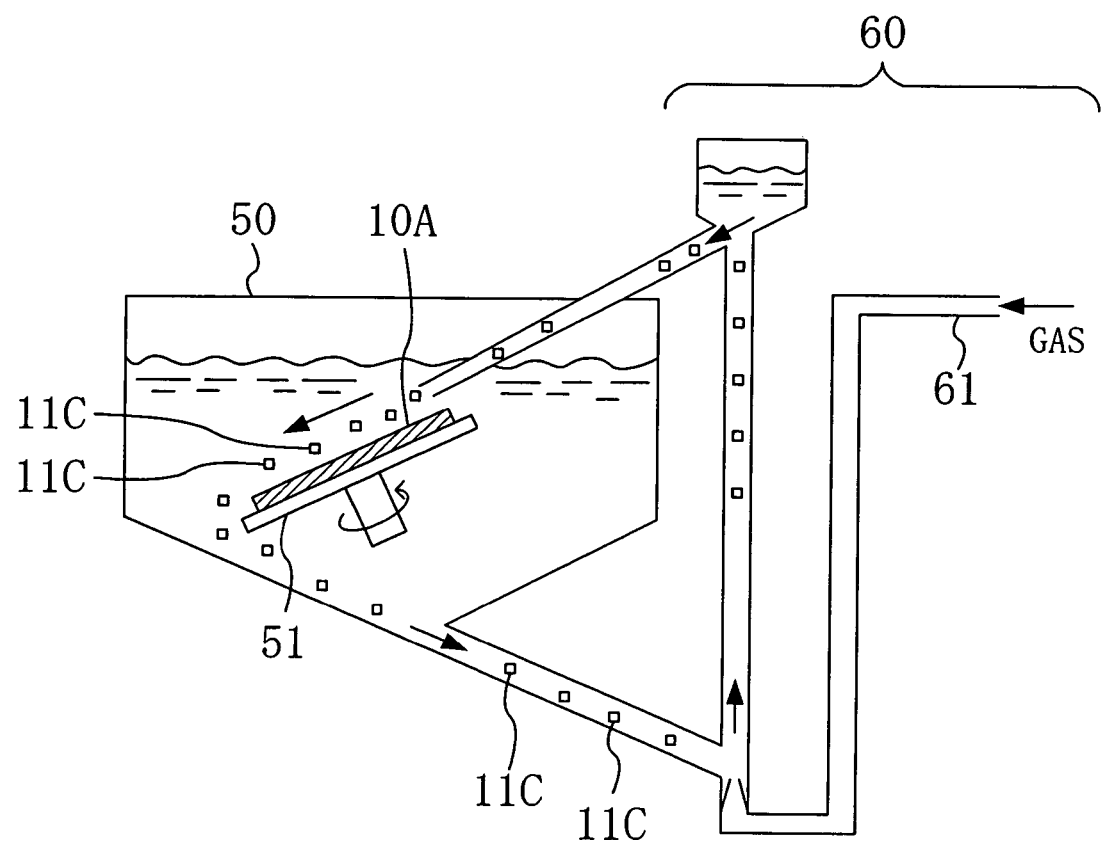
FIG. 8 is a diagram schematically illustrating equipment for mounting semiconductor laser chips which is used in the semiconductor laser device fabrication method in accordance with the embodiment of the present invention.

FIG. 8 schematically shows equipment for mounting a plurality of semiconductor laser chips 11C and 12C that have been formed into function blocks, using a FSA technique.

As shown in FIG. 8, the equipment includes a receptacle 50, a wafer holder 51, and a pump 60. The receptacle 50 is used to contain a fluid in the form of slurry in which a plurality of semiconductor laser chips in the form of function blocks have been spread. The wafer holder 51 provided on the bottom of the receptacle 50 is capable of rotating and used to hold a wafer 10A on its upper face. The pump 60 circulates the fluid in the form of slurry. The upper face of the wafer holder 51 is located slantingly with respect to the surface of the fluid.

The pump 60 is provided to circulate the fluid in the form of slurry inside the receptacle 50 by introduction of a nitrogen gas, for example, from a gas inlet portion 61, and to pour the circulated fluid over the upper face of the wafer holder 51.

Subsequently, a wafer 10A, in which a plurality of first and second recessed portions 10a and 10b and grooves 10g have been formed, is held on the wafer holder 51.

Thereafter, a fluid in the form of slurry, in which a plurality of semiconductor laser chips 11C have been spread, is poured over the entire principal surface of the wafer 10A that is held in a slanting position. Since the fluid in the form of slurry is circulated by the pump 60, the first semiconductor laser chips 11C which are not disposed into the first recessed portions 10a can be collected and reused any number of times.

In this method, if the wafer 10A held in the fluid is rotated in its plane direction, the first semiconductor laser chips 11C are more likely to be disposed in the recessed portions.

Then, after it is confirmed that the mounting of the first semiconductor laser chips 11C into the first recessed portions 10a in the wafer 10A has been completed, a plurality of second semiconductor laser chips 12C in the form of function blocks are spread in a fluid, and the second semiconductor laser chips 12C are disposed in second recessed portions 10b formed in the wafer 10A by operating the pump 60.

Figure 9:
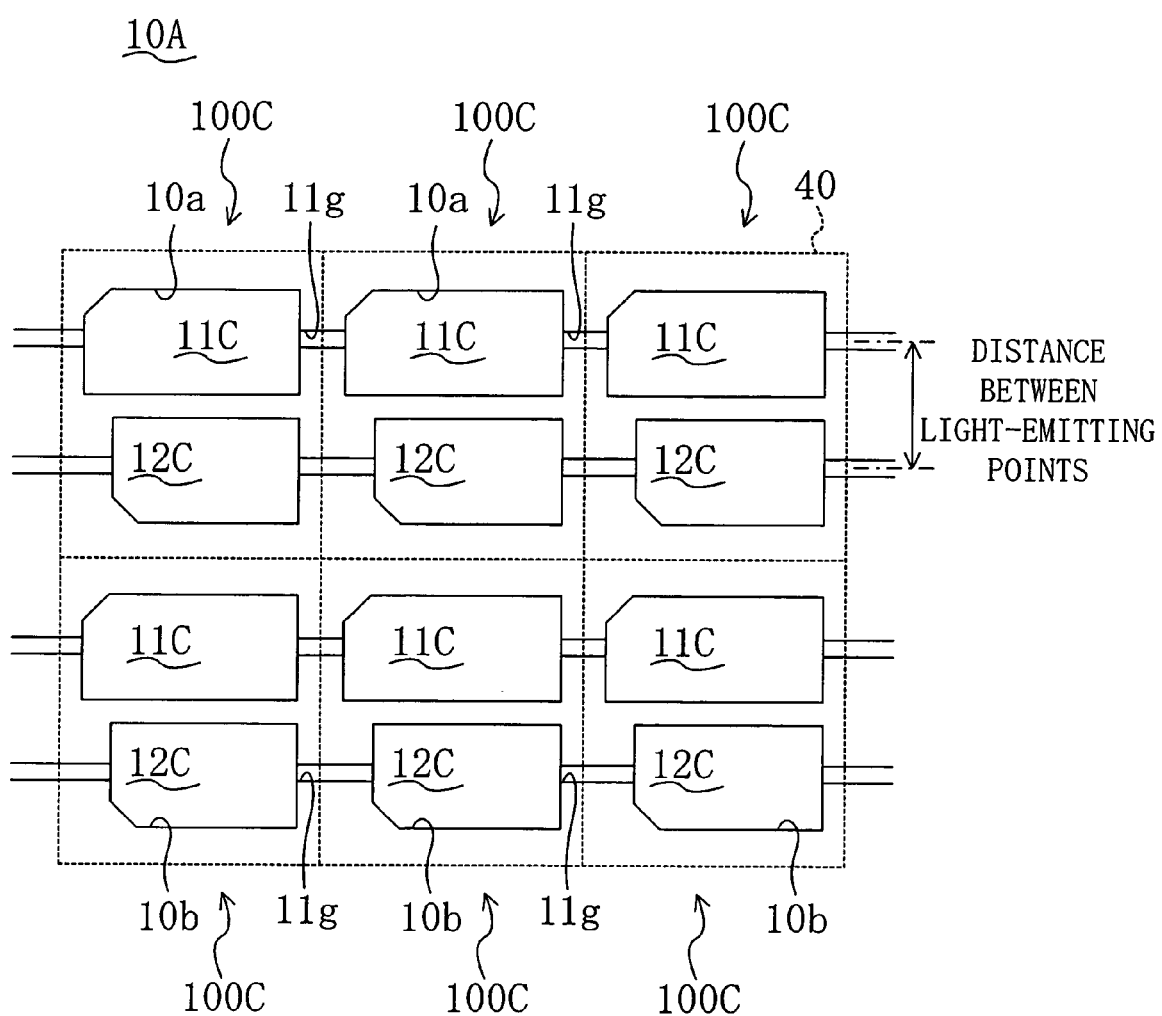
FIG. 9 is an enlarged partial plan view illustrating a substrate in a wafer state in which function blocks have been disposed according to the semiconductor laser device fabrication method in accordance with the embodiment of the present invention.

FIG. 9 shows on an enlarged scale a part of the wafer 10A in which the first and second semiconductor laser chips 11C and 12C have been disposed in the recessed portions 10a and 10b, respectively.

Thereafter, the first and second semiconductor laser chips 11C and 12C are secured. Specifically, when the first and second semiconductor laser chips 11C and 12C are secured by solder material or a thermosetting adhesive, the wafer 10A is heated. When they are secured with a UV-setting adhesive, the entire principal surface of the wafer 10A is irradiated with ultraviolet light.

Next, the wafer 10A is cut using a dicing saw, for example, along dicing lines 40 indicated by broken lines in FIG. 9, thereby cutting each semiconductor laser device 100C from the wafer 10A.

As described above, according to the semiconductor laser device fabrication method of this embodiment, the mounting process can be simplified significantly. In addition, since only the function blocks (semiconductor laser chips) that have been determined as being non-defective can be mounted, the cost of the semiconductor laser devices can be reduced.

Furthermore, the use of the FSA technology in the mounting of the semiconductor laser chips onto the wafer 10A permits the semiconductor laser chips to be positioned in a self-aligned manner, which increases yields.

What is claimed is:

1. A semiconductor laser device comprising:
a substrate having a plurality of recessed portions in its principal surface, and
a plurality of semiconductor laser chips each disposed in one of the recessed portions,
wherein the semiconductor laser chips are a facet-emitting type in which a laser beam is emitted from a facet,
plan configurations of the semiconductor laser chips and the recessed portions are asymmetrical,
the recessed portions are formed so that the respective emission directions of the semiconductor laser chips are aligned with each other and are substantially parallel to each other with a distance therebetween, and
a notch, through which a laser-emitting portion of an associated one of the semiconductor laser chips is exposed, is formed at an edge portion of the substrate to face the laser-emitting portion.

2. The device of claim 1, wherein the notch is formed in the substrate on front and rear facets of the semiconductor laser chips.

3. The device of claim 1, wherein the recessed portions and the notch have a same depth.

4. A semiconductor laser device comprising:
a substrate having a plurality of recessed portions in its principal surface, and
a plurality of semiconductor laser chips each disposed in one of the recessed portions,
wherein the semiconductor laser chips are a facet-emitting type in which a laser beam is emitted from a facet,
in each said semiconductor laser chip, optical output from its front facet is equal to optical output from its rear facet,
the recessed portions are formed so that the respective emission directions of the semiconductor laser chips are aligned with each other, and
a notch, through which a laser-emitting portion of an associated one of the semiconductor laser chips is exposed, is formed in the substrate to face the laser-emitting portion.

5. A semiconductor laser device comprising:
a substrate having a plurality of recessed portions in its principal surface, and
a plurality of semiconductor laser chips each disposed in one of the recessed portions,
wherein the semiconductor laser chips are a facet-emitting type in which a laser beam is emitted from a facet,
plan configurations of the semiconductor laser chips and the recessed portions are asymmetrical,
the recessed portions are formed so that the respective emission directions of the semiconductor laser chips are aligned with each other and are substantially parallel to each other with a distance therebetween, and
a notch, through which a laser-emitting portion of an associated one of the semiconductor laser chips is exposed, is formed in the substrate to face the laser-emitting portion, and
the plan configurations of the semiconductor laser chips vary in accordance with their emission wavelengths.

6. A semiconductor laser device comprising:
a substrate having a plurality of recessed portions in its principal surface, and
a plurality of semiconductor laser chips each disposed in one of the recessed portions,
wherein the semiconductor laser chips are a facet-emitting type in which a laser beam is emitted from a facet,
plan configurations of the semiconductor laser chips and the recessed portions are asymmetrical,
the recessed portions are formed so that the respective emission directions of the semiconductor laser chips are aligned with each other and are substantially parallel to each other with a distance therebetween, and
a notch, through which a laser-emitting portion of an associated one of the semiconductor laser chips is exposed, is formed in the substrate to face the laser-emitting portion, and
the semiconductor laser chips vary in shape in accordance with their optical outputs.

7. A semiconductor laser device comprising:
a substrate having a plurality of recessed portions in its principal surface, and
a plurality of semiconductor laser chips each disposed in one of the recessed portions,
wherein a chip electrode is formed on a face of each said semiconductor laser chip which faces the bottom face of the associated one of the recessed portions,
the recess electrode is formed such that an end portion of the recess electrode extends beyond the principal surface of the substrate and so as to be shared by the semiconductor laser chips, and
a notch, through which a laser-emitting portion of an associated one of the semiconductor laser chips is exposed, is formed in the substrate to face the laser-emitting portion.

* * * * *